(12) United States Patent
Farnworth et al.

(10) Patent No.: US 8,637,994 B2
(45) Date of Patent: *Jan. 28, 2014

(54) MICROFEATURE WORKPIECES HAVING ALLOYED CONDUCTIVE STRUCTURES, AND ASSOCIATED METHODS

(75) Inventors: Warren M. Farnworth, Nampa, ID (US); Rick C. Lake, Meridian, ID (US); William M. Hiatt, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/605,761

(22) Filed: Sep. 6, 2012

(65) Prior Publication Data

US 2013/0004792 A1 Jan. 3, 2013

Related U.S. Application Data

(62) Division of application No. 11/217,149, filed on Aug. 31, 2005, now Pat. No. 8,308,053.

(51) Int. Cl.
*H01L 21/441* (2006.01)
*H01L 29/40* (2006.01)
*B23K 35/14* (2006.01)

(52) U.S. Cl.
USPC ........... 257/774; 257/772; 257/773; 257/775; 228/244; 228/245; 228/256; 438/612; 438/613

(58) Field of Classification Search
USPC .......................... 228/244, 245, 256; 438/613; 257/772–775
See application file for complete search history.

(56) References Cited

U.S. PATENT DOCUMENTS

| | | | |
|---|---|---|---|
| 5,470,787 A | 11/1995 | Greer | |
| 5,480,835 A | 1/1996 | Carney et al. | |
| 5,814,889 A | 9/1998 | Gaul | |
| 5,903,058 A | 5/1999 | Akram | |
| 6,197,181 B1 | 3/2001 | Chen | |
| 7,037,836 B2 | 5/2006 | Lee | |
| 7,629,249 B2 | 12/2009 | Borthakur | |
| 2002/0125581 A1* | 9/2002 | Lin | 257/778 |
| 2004/0121267 A1 | 6/2004 | Jang | |
| 2005/0127478 A1 | 6/2005 | Hiatt et al. | |
| 2005/0227382 A1 | 10/2005 | Hui | |
| 2005/0275096 A1 | 12/2005 | Zeng et al. | |

(Continued)

OTHER PUBLICATIONS

Anand, A. and Y.C. Mui, "Lead-free Solder Evaluation for Ball Attache Process," 2002 Electronics Packaging Technology Conference, pp. 6-10, Dec. 2002, IEEE, ISBN: 0-7803-7435-5.

(Continued)

*Primary Examiner* — Devang R Patel
(74) *Attorney, Agent, or Firm* — Perkins Coie LLP

(57) ABSTRACT

Microfeature workpieces having alloyed conductive structures, and associated methods are disclosed. A method in accordance with one embodiment includes applying a volume of material to a target location of a microfeature workpiece, with the volume of material including at least a first metallic constituent. The method can further include elevating a temperature of the volume of material while the volume of material is applied to the microfeature workpiece to alloy the first metallic constituent and a second metallic constituent so that the second metallic constituent is distributed generally throughout the volume of material. In further particular embodiments, the second metallic constituent can be drawn from an adjacent structure, for example, a bond pad or the wall of a via in which the volume of material is positioned.

16 Claims, 16 Drawing Sheets

(56) References Cited

U.S. PATENT DOCUMENTS

| | | |
|---|---|---|
| 2006/0046471 A1 | 3/2006 | Kirby et al. |
| 2006/0249849 A1 | 11/2006 | Cohen |
| 2006/0289968 A1 | 12/2006 | Sulfridge |
| 2006/0290001 A1* | 12/2006 | Sulfridge ............. 257/774 |
| 2007/0045388 A1 | 3/2007 | Farnworth et al. |
| 2007/0125834 A1 | 6/2007 | Chew et al. |
| 2008/0265933 A1 | 10/2008 | Tanioka et al. |

OTHER PUBLICATIONS

Ezawa, H. et al., Pb-Free Bumping by Alloying Electroplated Metal Stacks, 2003 Electronic Components and Technology Conference Proceedings, May 2003, pp. 664-667, DOI: 10.1109/ECTC.2003.1216353.

Takahashi, K., 3D Chip-Stacking Technology and Industrial Applications, presented at 3D Architectures for Semiconductor Integration and Packaging, Insight Into Advanced Technologies, Initiatives, Challenges, and Opportunities, Jun. 15, 2005.

\* cited by examiner

MICROFEATURE WORKPIECES HAVING ALLOYED CONDUCTIVE STRUCTURES, AND ASSOCIATED METHODS

CROSS-REFERENCE TO RELATED APPLICATION

This application is a divisional of U.S. application Ser. No. 11/217,149 filed Aug. 31, 2005, now U.S. Pat. No. 8,308,053, which is incorporated herein by reference in its entirety.

TECHNICAL FIELD

The present invention is directed generally toward microfeature workpieces having alloyed conductive structures, and associated methods, including associated methods of formation.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

Many imaging devices include semiconductor dies having image sensors located on a front surface of the die to receive incoming radiation. The dies also include bond pads for electrically coupling the sensors to other circuit elements. In order to prevent the bond pads from interfering with the operation of the sensors, or limiting the size and/or location of the sensors, the bond pads are typically positioned on the opposite side of the die from the sensors (e.g., on the back surface of the die). Through-wafer interconnects (TWIs) are used to conduct electrical signals from the sensors and associated internal circuitry, through the die to the bond pads at the back surface. The TWIs are typically formed by making a blind via in the die, filling the via with solder, and then grinding the back surface of the die to expose the blind end of the via, which is used to form the bond pad. A solder ball can then be attached to the bond pad and can be reflowed to couple the die to external devices.

One potential drawback associated with the foregoing approach is that, when the solder ball is later reflowed to electrically attach the die to external devices, the solder within the via may also tend to melt or at least soften. During the ensuing attach process, the solder within the via can be pulled at least partially out of the via, or can otherwise undergo deformations and/or movement that can adversely affect the electrical continuity of the TWI. In some instances, the electrical continuity of the TWI may be disrupted, causing the electrical connection between the image sensor and the external devices to fail. Accordingly, there is a need for an improved arrangement for forming microfeature workpiece electrical connections, including connections between dies and external devices.

DETAILED DESCRIPTION

A. Overview/Summary

Figure 1A:
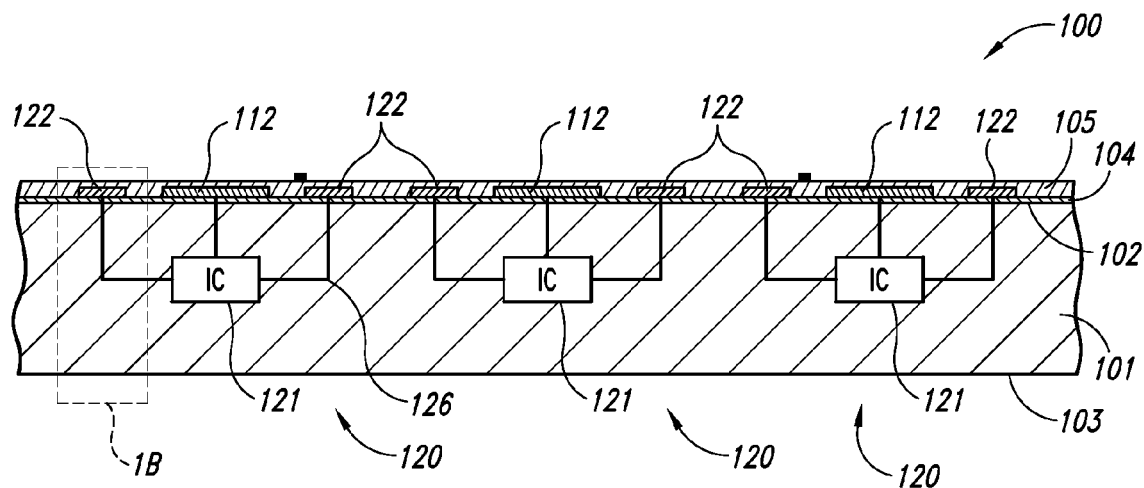
FIG. 1A is a partially schematic, cross-sectional illustration of a substrate prior to formation of a conductive structure in accordance with an embodiment of the invention.

The following disclosure describes several embodiments of microfeature workpieces having alloyed conductive structures, and associated methods for forming such structures. One such method includes applying a volume of material to a target location of a microfeature workpiece, with the volume of material including at least a first metallic constituent. The method can further include elevating a temperature of the volume of material while the volume of material is applied to the microfeature workpiece to alloy the first metallic constituent and a second metallic constituent so that the second metallic constituent is distributed generally throughout the volume of material.

In particular aspects of the invention, the target location can include a via extending through the microfeature workpiece. Applying a volume of material can include applying a volume of solder having a first metallic constituent that includes an alloy of tin and silver. The second metallic constituent can include copper that is initially disposed as a layer on a wall of the via. The copper can alloy with the tin and silver as a result of elevating the temperature of the microfeature workpiece. The temperature can be elevated to be in the range of from about 240° C. to about 260° C. Alloying the first and second metallic constituents can include forming an alloy having a melting point that is higher than a melting point of the first metallic constituent alone. In still further aspects, the second metallic constituent can include gold. The method can further include dispersing silicon particulates in the volume of material (for example, while forming a via vent), and elevating a temperature of the volume of material can include alloying the silicon particulates with the gold.

In yet further aspects, the target location can include a bond pad. The volume of material can alloy with a second metallic constituent that is received from the bond pad. Whether the target location includes a bond pad, via, or other structure, the second metallic constituent can be located in the volume of material when the volume of material is applied to the target location, and/or the second metallic constituent can be located at the target location.

When the target location includes the second metallic constituent, alloying the first metallic constituent with at least a portion of the second metallic constituent can include alloying the first metallic constituent with all of the second metallic constituent at the target location. In other aspects, less than all of the second metallic constituent at the target location can be alloyed with the first metallic constituent. In still further aspects, alloying the first and second metallic constituents can include alloying the first and second metallic constituents at a first rate, and the method can further comprise cooling the microfeature workpiece and continuing to alloy the first and second metallic constituents at a second rate less than the first rate.

A method for processing a microfeature workpiece in accordance with yet another aspect of the invention includes applying a volume of material between a first target location of a microfeature workpiece and a second target location of a support member. The volume of material can include at least a first metallic constituent. The method can further include elevating a temperature of the volume of material while the volume of material is applied between the microfeature workpiece and the support member to alloy the first metallic constituent and a second metallic constituent so that the second metallic constituent is distributed generally throughout the volume of material. The volume of material can include a volume of solder adjacent to a bond pad of the support member, with the bond pad including the second metallic constituent, and alloying the constituents can include alloying the first metallic constituent with at least a portion of the second metallic constituent from the bond pad.

Further aspects of the invention are directed to microfeature systems. A microfeature system in accordance with one aspect includes a microfeature workpiece having a surface with a first portion of a metallic constituent, wherein the metallic constituent is the second of two metallic constituents. The system can further include a volume of material positioned adjacent to the surface, the volume of material including the first of the two metallic constituents, and further including a second portion of the second metallic constituent distributed generally throughout the volume of material. The surface adjacent to which the volume of material is positioned can include the surface of a bond pad or the surface of a via. In particular aspects, the volume of material can include solder, and the second metallic constituent can include copper or gold.

A microfeature system in accordance with still another aspect of the invention can include a microfeature workpiece having a conductive surface, and a volume of material positioned adjacent to the conductive surface. The volume of material can include first and second metallic constituents, wherein the second metallic constituent includes at least one percent copper by weight. In particular aspects, the volume of material can have a melting point of from about 240° C. to about 260° C., and the conductive surface can include a bond pad surface or a via surface.

Specific details of several embodiments of the invention are described below with reference to CMOS image sensors to provide a thorough understanding of these embodiments, but other embodiments can use CCD image sensors or other types of solid-state imaging devices. In still further embodiments, aspects of the invention can be practiced in connection with devices that do not include image sensors. As used herein, the terms "microfeature workpiece" and "workpiece" refer to substrates on and/in which microfeature electronic devices (including, but not limited to, image sensors) are integrally formed. Typical microfeature electronic devices include microfeature electronic circuits or components, thin-film recording heads, data storage elements, microfluidic devices and other products. Micromachines and micromechanical devices are included within this definition because they are manufactured using much of the same technology that is used in the fabrication of integrated circuits. The substrates can be semi-conductive pieces (e.g., doped silicon wafers or gallium arsenide wafers), non-conductive pieces (e.g., various ceramic substrates) or conductive pieces. In some cases, the workpieces are generally round, and in other cases the workpieces can have other shapes, including rectilinear shapes. Several embodiments of systems and methods for forming alloyed conductive structures in connection with microfeature workpiece fabrication are described below. A person skilled in the relevant art will understand, however, that the invention has additional embodiments, and that the invention may be practiced without several of the details of the embodiments described below with reference to FIGS. 1A-8B.

B. Methods for Forming Alloyed Conductive Structures

FIG. 1A is a side cross-sectional view of a portion of an imager workpiece 100 prior to the formation of conductive interconnect structures in accordance with an embodiment of the invention. The workpiece 100 can include a substrate 101 with a plurality of imaging dies 120 formed in and/or on the substrate 101. The substrate 101 has a first side or surface 102 and a second side or surface 103. The substrate 101 can be a semiconductor wafer, with the imaging dies 120 arranged in a die pattern on the wafer. Individual dies 120 can include integrated circuitry 121, a plurality of terminals or bond sites 122 (e.g., bond pads) electrically coupled to the integrated circuitry 121 with couplers 126, and an image sensor 112. The image sensors 112 can be CMOS image sensors or CCD image sensors for capturing pictures or other images in the visible spectrum. In other embodiments, the image sensors 112 can detect radiation in other spectrums (e.g., IR or UV ranges). The bond sites 122 shown in FIG. 1A are external features at the first side 102 of the substrate 101. In other embodiments, however, the bond sites 122 can be internal features that are embedded at an intermediate depth within the substrate 101. First and second dielectric layers 104 and 105 can be located at the first side 102 to protect the underlying substrate 101.

Figure 1B:
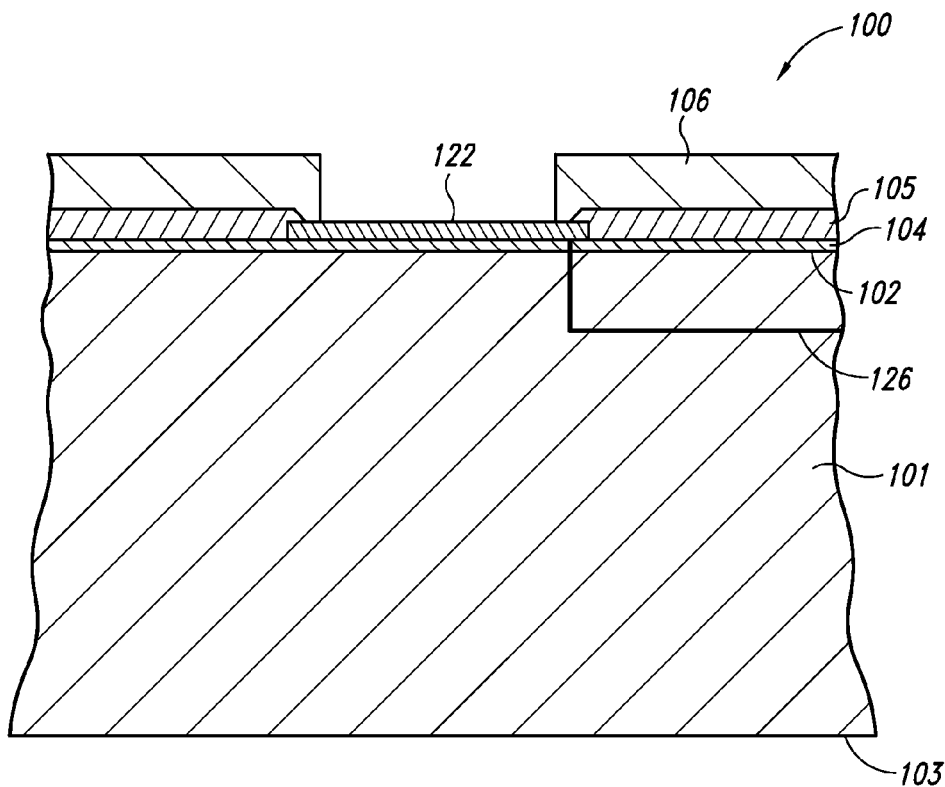
FIG. 1B is an enlarged view of a portion of the substrate shown in FIG. 1A.

FIG. 1B is a side cross-sectional view of the area 1B shown in FIG. 1A. The second dielectric layer 105 has been patterned and etched to expose the bond site 122. A mask 106 is applied over the second dielectric layer 105 and patterned as shown in FIG. 1B. The mask 106 can be a layer of resist that is patterned according to the arrangement of bond sites 122 on the substrate 101. Accordingly, the mask 106 can have an opening over each bond site 122.

Figure 2A:
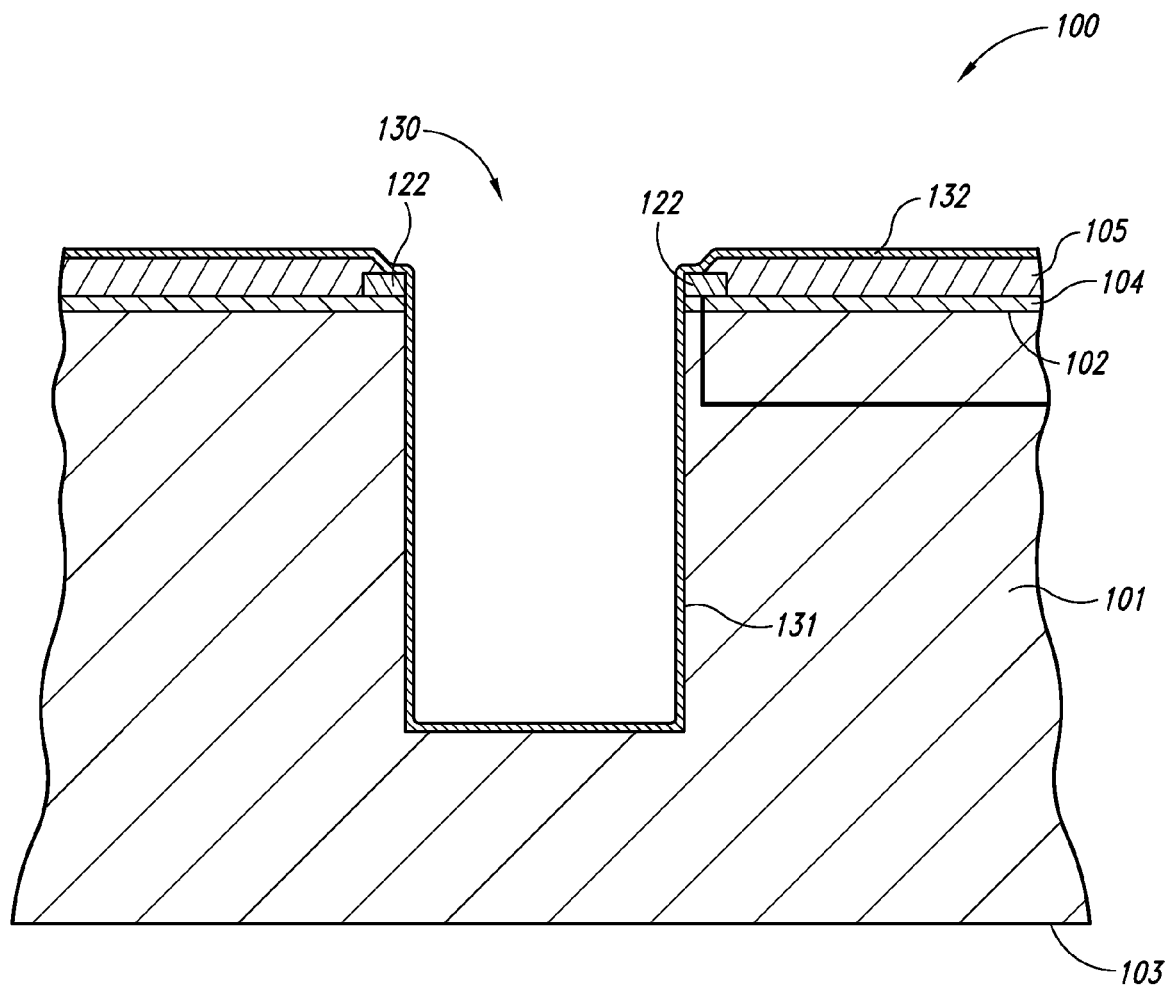
FIGS. 2A-2I illustrate a process for introducing a volume of material in a via and alloying the material in accordance with an embodiment of the invention.

Referring next to FIG. 2A, a via 130 has been formed in the workpiece 100 so as to extend into the substrate 101 through the bond site 122 and the first surface 102. The via 130 can be formed using any of a variety of techniques, including etching or laser drilling. Further details of methods for forming the via 130 are disclosed in U.S. Patent Application Publication No. 2006/0290001, which is incorporated herein by reference. A third dielectric layer 132 is deposited onto the workpiece 100 to line the sidewalls 131 of the via 130 within the substrate 101. The third dielectric layer 132 electrically insulates components in the substrate 101 from an interconnect structure that is subsequently formed in the via 130.

Figure 2B:
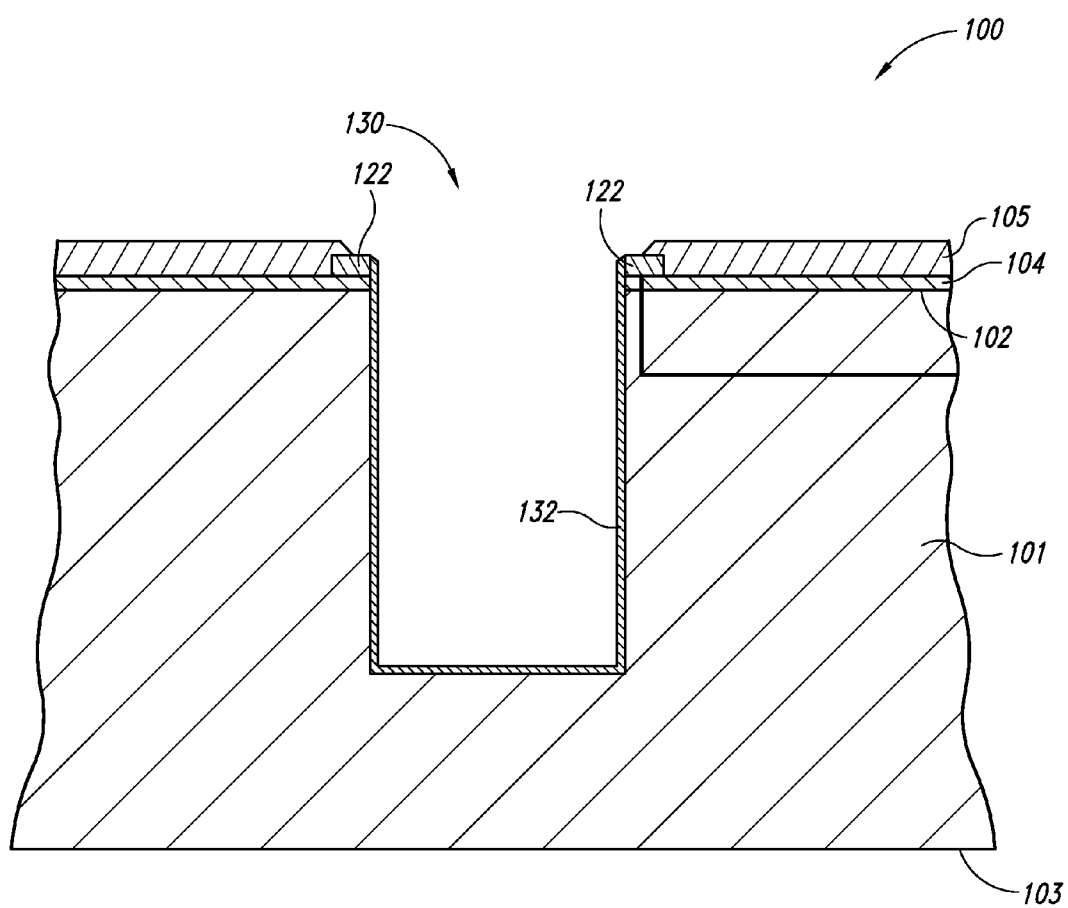

Referring to FIG. 2B, a suitable etching process (e.g., a spacer etch) is used to remove the third dielectric layer 132 from at least a portion of the bond site 122. Accordingly, this portion of the bond site 122 can be exposed for electrical coupling to conductive structures in the via 130.

Figure 2C:
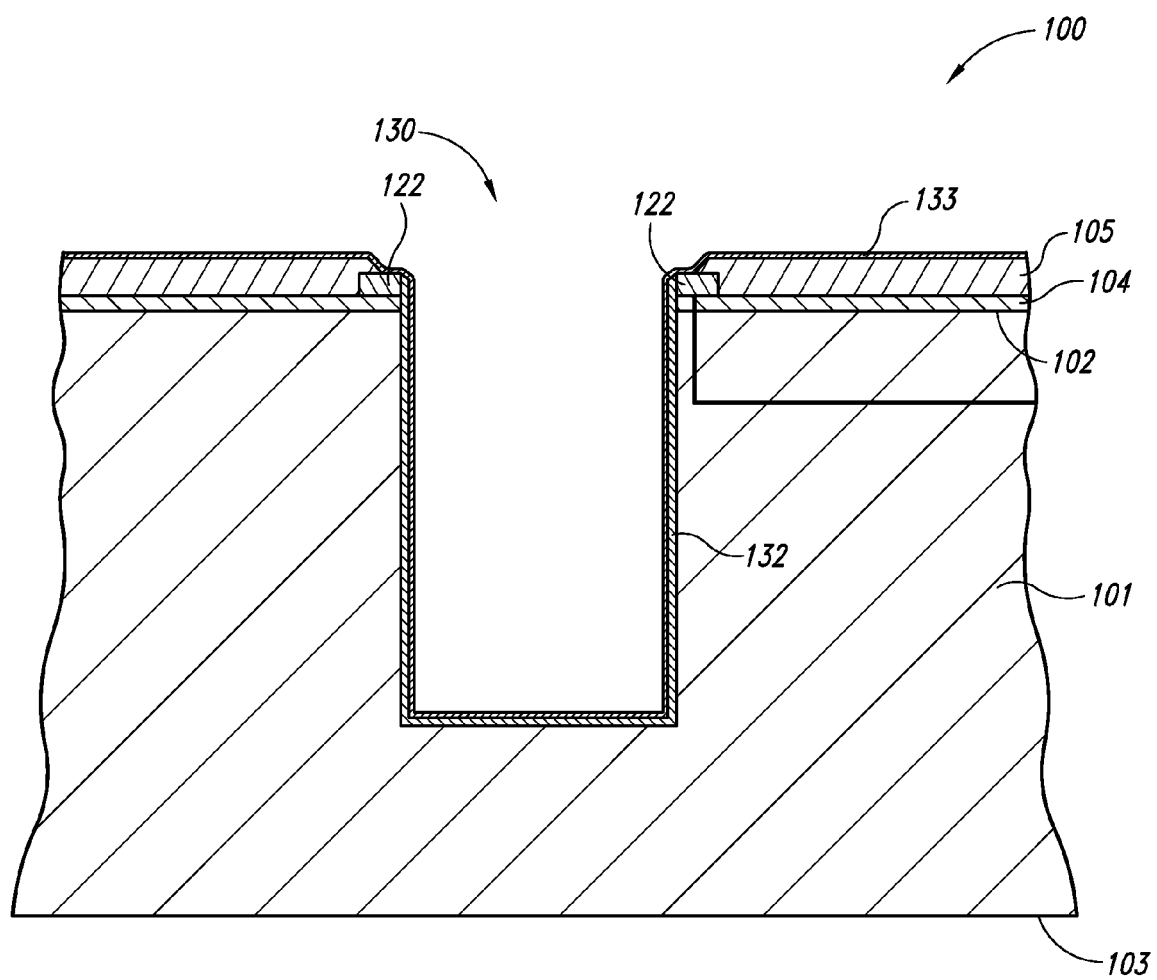

As shown in FIG. 2C, a conductive barrier layer 133 is then deposited onto the workpiece 100 over the third dielectric layer 132 so as to be in electrical contact with the bond site 122. The barrier layer 133 generally covers the second dielectric layer 105 and the bond site 122 in addition to the third dielectric layer 132. In one embodiment, for example, the barrier layer 133 is a layer of tantalum that is deposited onto the workpiece 100 using a physical vapor deposition (PVD) process. The thickness of the barrier layer 133 is about 150 Angstroms. In other embodiments, the barrier layer 133 may be deposited onto the workpiece 100 using other vapor deposition processes, such as chemical vapor deposition (CVD), and/or may have a different thickness. The composition of the barrier layer 133 is not limited to tantalum, but rather may be composed of tungsten or other suitable materials.

Figure 2D:
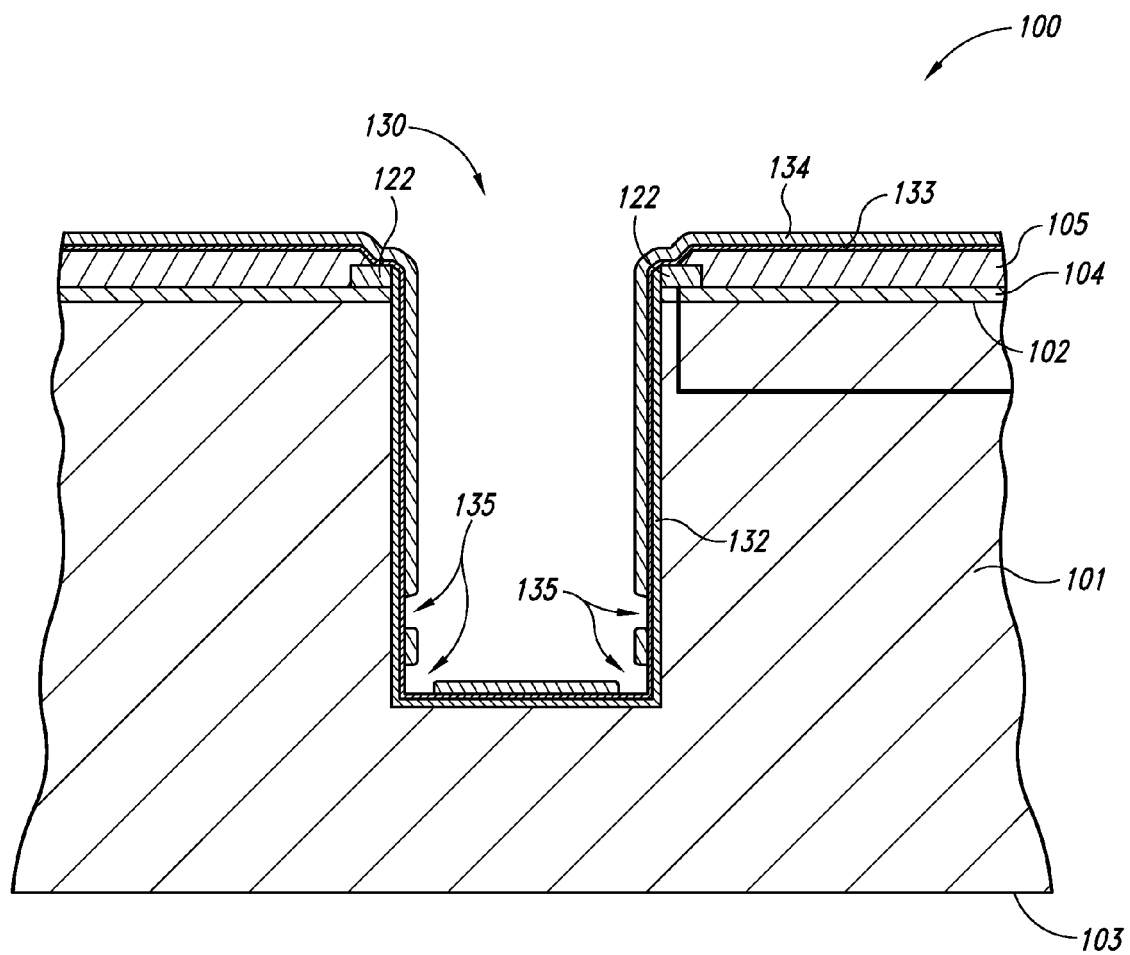
Figure 2E:
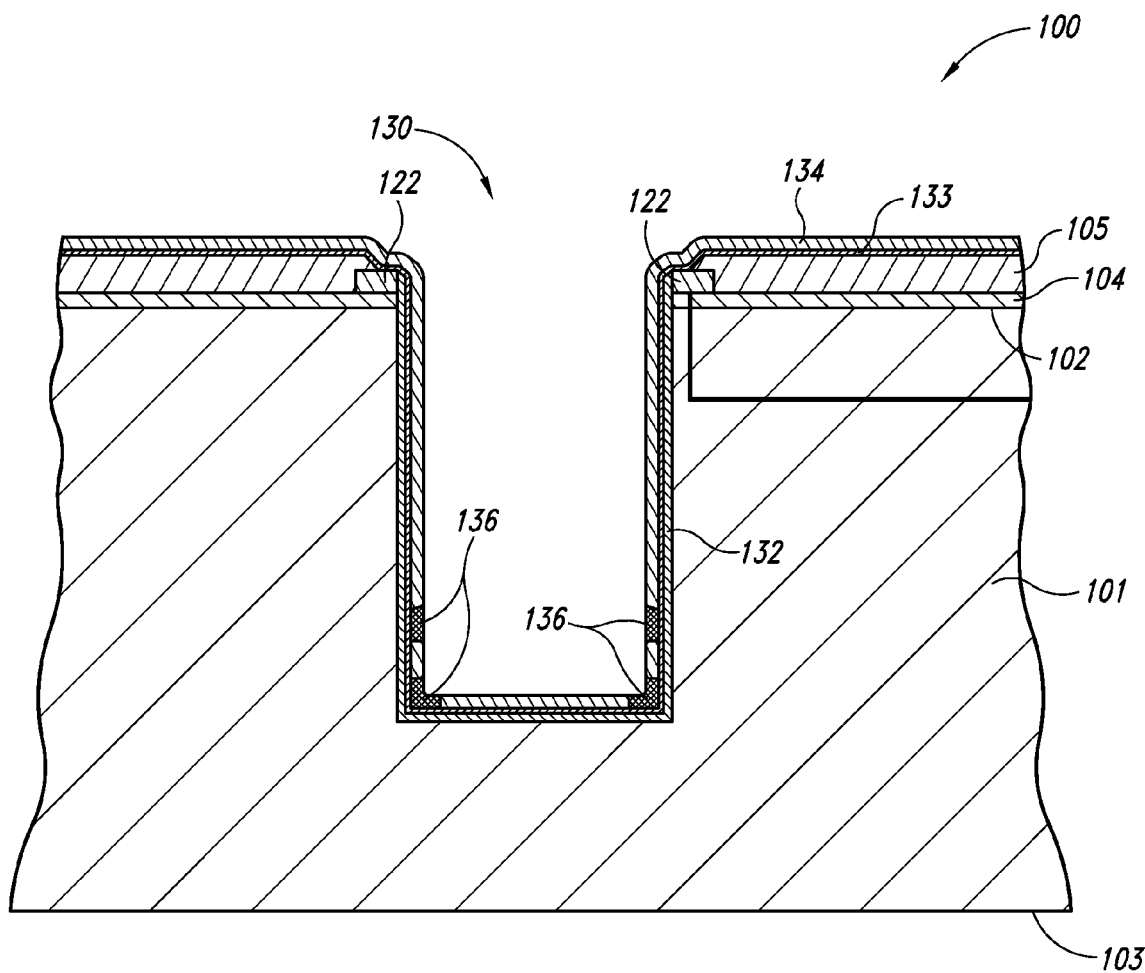

Referring next to FIG. 2D, a seed layer 134 is deposited onto the barrier layer 133. The seed layer 134 can be deposited using vapor deposition techniques, such as PVD, CVD, atomic layer deposition, and/or plating. The seed layer 134 can be composed of copper or other suitable materials. The thickness of the seed layer 134 may be about 2000 Angstroms, but can be more or less depending upon the depth and aspect ratio of the via 130. In several embodiments, the seed layer 134 may not uniformly cover the barrier layer 133 such that the seed layer 134 has voids 135 within the via 130. This can cause non-uniform electroplating in the via 130 and across the workpiece 100. When the seed layer 134 is deficient, it may be enhanced using a process that fills voids or noncontinuous regions of the seed layer 134 to form a more uniform seed layer. Referring to FIG. 2E, for example, voids 135 and/or noncontinuous regions of the seed layer 134 have been filled with additional material 136, such as copper or another suitable material. One suitable seed layer enhancement process is described in U.S. Pat. No. 6,197,181, which is incorporated by reference.

Figure 2F:
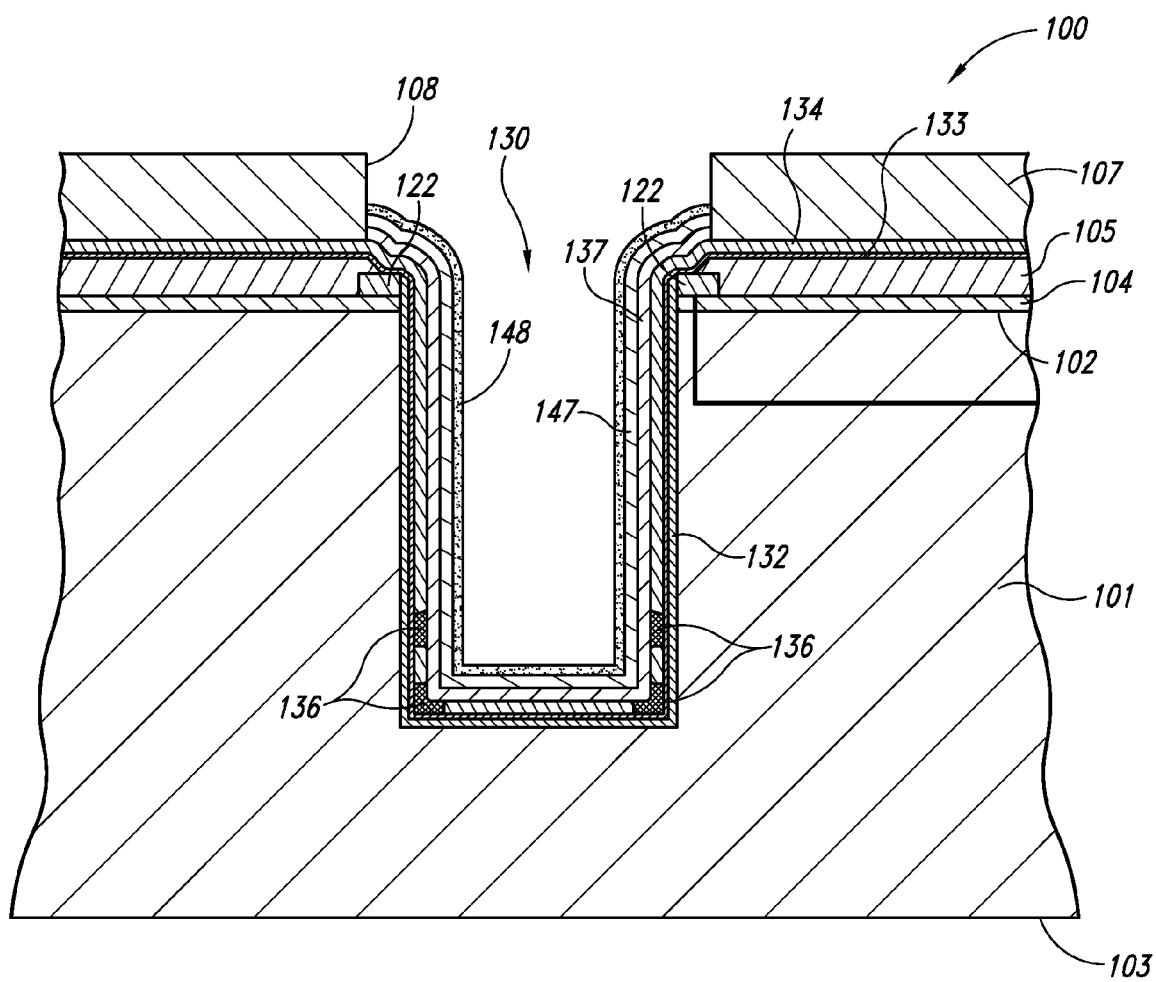

Referring next to FIG. 2F, a resist layer 107 is deposited onto the seed layer 134 and is patterned to have an opening 108 over the bond site 122 and corresponding via 130. A first conductive layer 137 is then deposited onto the exposed portions of the seed layer 134 in the via 130. The first conductive layer 137 can include copper that is deposited onto the seed layer 134 in an electroless plating operation, or an electroplating operation, or by another suitable method. In the illustrated embodiment, the thickness of the first conductive layer 137 is about 1 micron. In other embodiments, the first conductive layer 137 may include other suitable materials and/or have a different thickness. A second conductive layer 147 can then be deposited on the first conductive layer 137. The second conductive layer 147 can include nickel or another adhesion barrier that prevents or restricts migration of the material (e.g., copper) in the first conductive layer 137.

A third conductive layer 148 can then be disposed on the second conductive layer 147. The third conductive layer 148 can also include copper. In particular embodiments, the third conductive layer 148 is configured so as to deliberately lose material during the formation of an alloy in the via 130. Accordingly, the thickness of the third conductive layer 148 can be selected based on how much material from the third conductive layer 148 is expected to be used up in the formation of the alloy. The second conductive layer 147 can act as a barrier to prevent a further loss of material from the first conductive layer 137. Alternatively, the second conductive layer 147 and the third conductive layer 148 can be eliminated, and the first conductive layer 137 can be made thick enough to withstand the loss of material during the alloying process. Further details of an arrangement in which the second and third layers are both present are described below with reference to FIGS. 2H and 3. However, it will be understood that aspects of the invention may also be practiced with just the first conductive layer 137, provided it is thick enough. Further details of several embodiments for disposing the conductive materials in the via 130 are disclosed in U.S. Pat. No. 7,795,134, which is incorporated herein by reference.

Figure 2G:
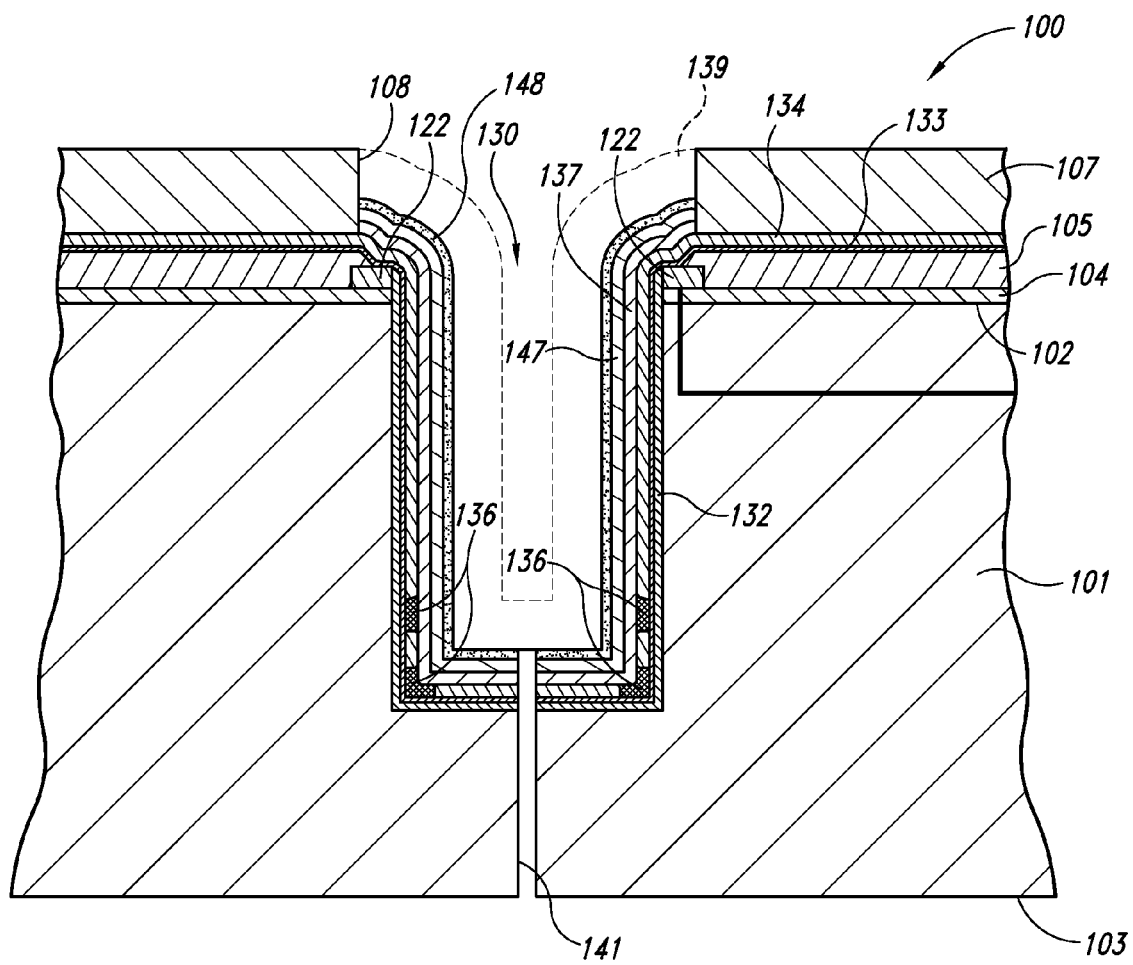

Referring next to FIG. 2G, a vent hole 141 is formed in the substrate 101 extending from the second side 103 of the substrate 101 to a bottom portion of the via 130. The vent hole 141 can be formed using a laser that is aligned with the via 130 and/or the corresponding bond site 122 using scanning/alignment systems known in the art. A suitable laser is the Xise200, commercially available from Xsil Ltd. of Dublin, Ireland. After forming the vent hole 141, it is generally cleaned to remove ablated byproducts (e.g., slag). For example, the vent hole 141 can be cleaned using a suitable cleaning agent, such as 6% tetramethylammonium hydroxide (TMAH): propylene glycol. In other embodiments, the vent hole 141 may not be cleaned.

In several embodiments, a temporary protective filling or coating 139 (shown in broken lines) can be deposited into the via 130 before forming the vent hole 141. The protective filling 139 can be a photoresist, a polymer, water, a solidified liquid or gas, or another suitable material. The protective filling 139 protects the sidewalls of the via 130 from slag produced during the laser drilling process. The slag can negatively affect the wetting of a conductive fill material in the via 130. The protective filling 139 can be removed after forming the vent hole 141.

Figure 2H:
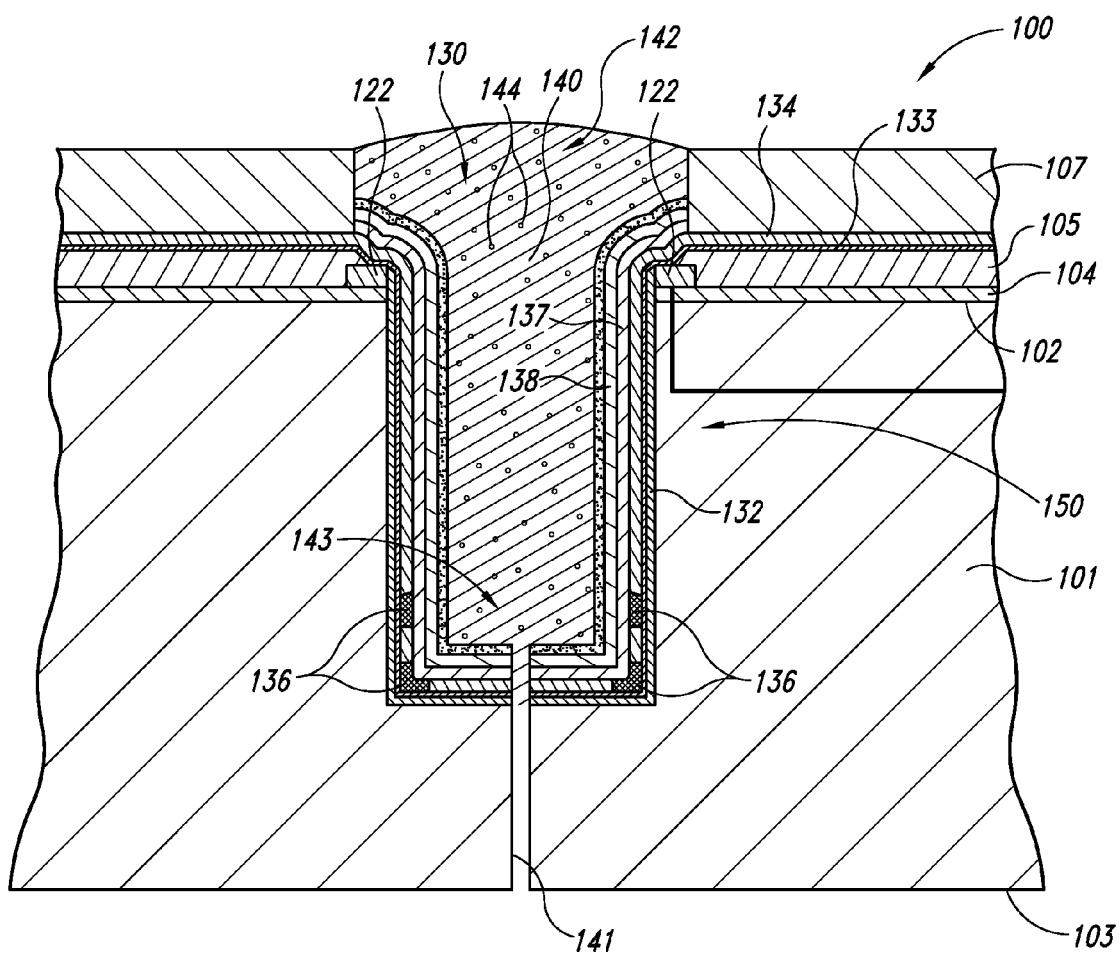

Referring next to FIG. 2H, a volume of material 140 (e.g., fill material) is deposited into the via 130 to form an interconnect structure 150. The interconnect structure 150 has a first end 142 proximate to the bond site 122 and a second end 143 toward the bottom of the via 130. The material volume 140 can include a first metallic constituent 144, shown schematically by open circles in FIG. 2H. The first metallic constituent 144 can include a single metallic element, or in many cases, a mixture or alloy of multiple elements. For example, the first metallic constituent 144 can include a solder that in turn includes one or more of tin, silver, copper, lead, gold and nickel. In some embodiments, the entire material volume 140 can be comprised of the first metallic constituent 144 and in other embodiments, the material volume 140 can include substances in addition to the first metallic constituent 144. The material volume 140 can be introduced into the via 130 using plating processes (e.g., electroplating or electroless plating), solder wave processes, screen printing processes, reflow processes, vapor deposition processes, or other suitable techniques.

Figure 2I:
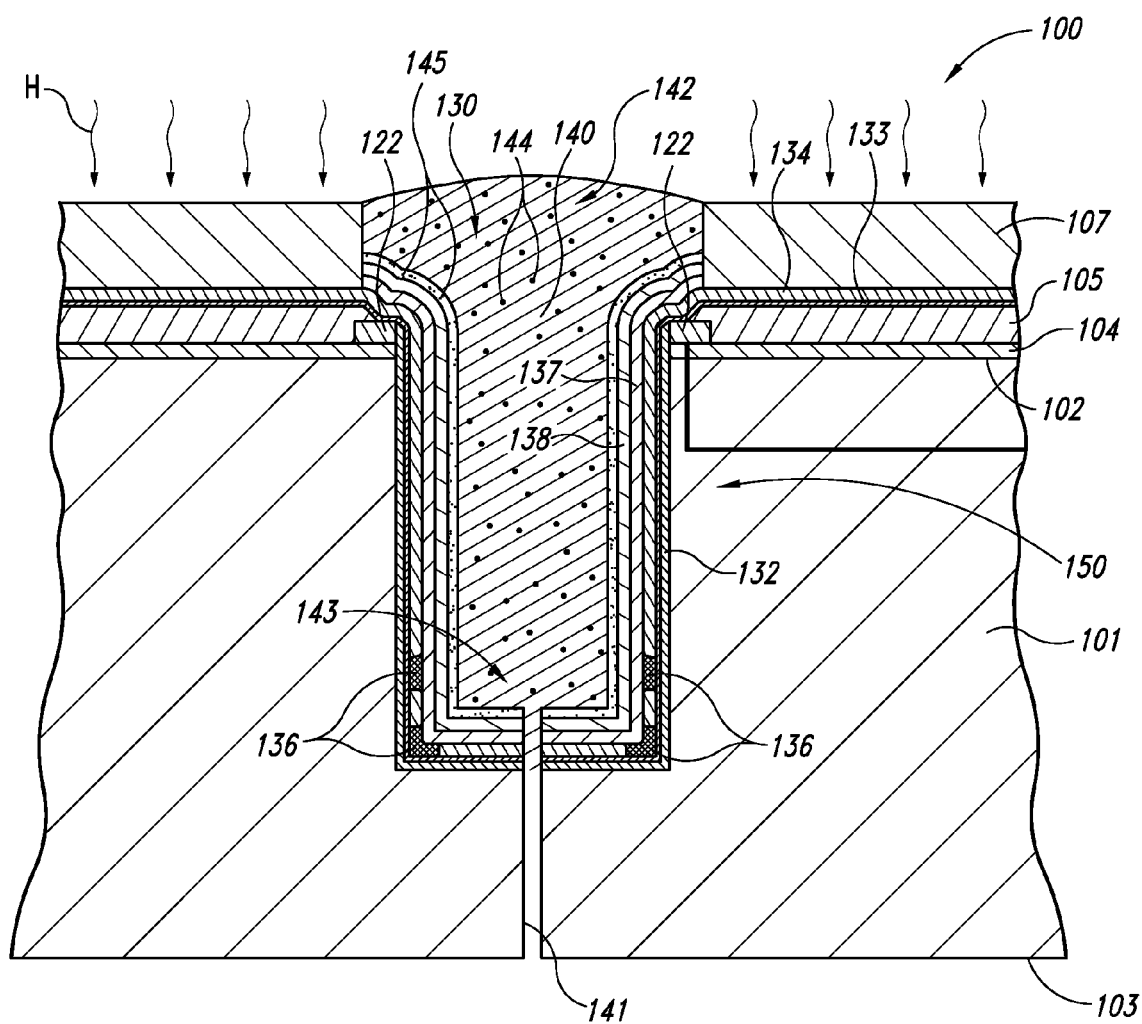

Referring next to FIG. 2I, heat (indicated by arrows H) can be applied to the material volume 140 to increase the temperature of the material volume 140 and, in at least some cases, melt or at least partially increase the flowability of the material volume 140 and the first metallic constituent 144. The application of heat can also cause a second metallic constituent 145 (shown schematically as speckles) to enter the material volume 140 from the third conductive layer 148. For example, when the third conductive layer 148 includes copper, at least a portion of the copper can enter the material volume 140. Moreover, the second metallic constituent 145 can dissolve into, alloy with, and/or otherwise chemically bond with the first metallic constituent 144. The alloyed first metallic constituent 144 is shown schematically by solid circles in FIG. 2I. In so doing, the second metallic constituent 145 can become generally distributed throughout the material volume 140. As used herein, the term "generally distributed" refers to a distribution that extends beyond just the interface between the material volume 140 and the third conductive layer 148. The term "generally distributed" includes, but is not limited to, a uniform distribution.

Figure 3:
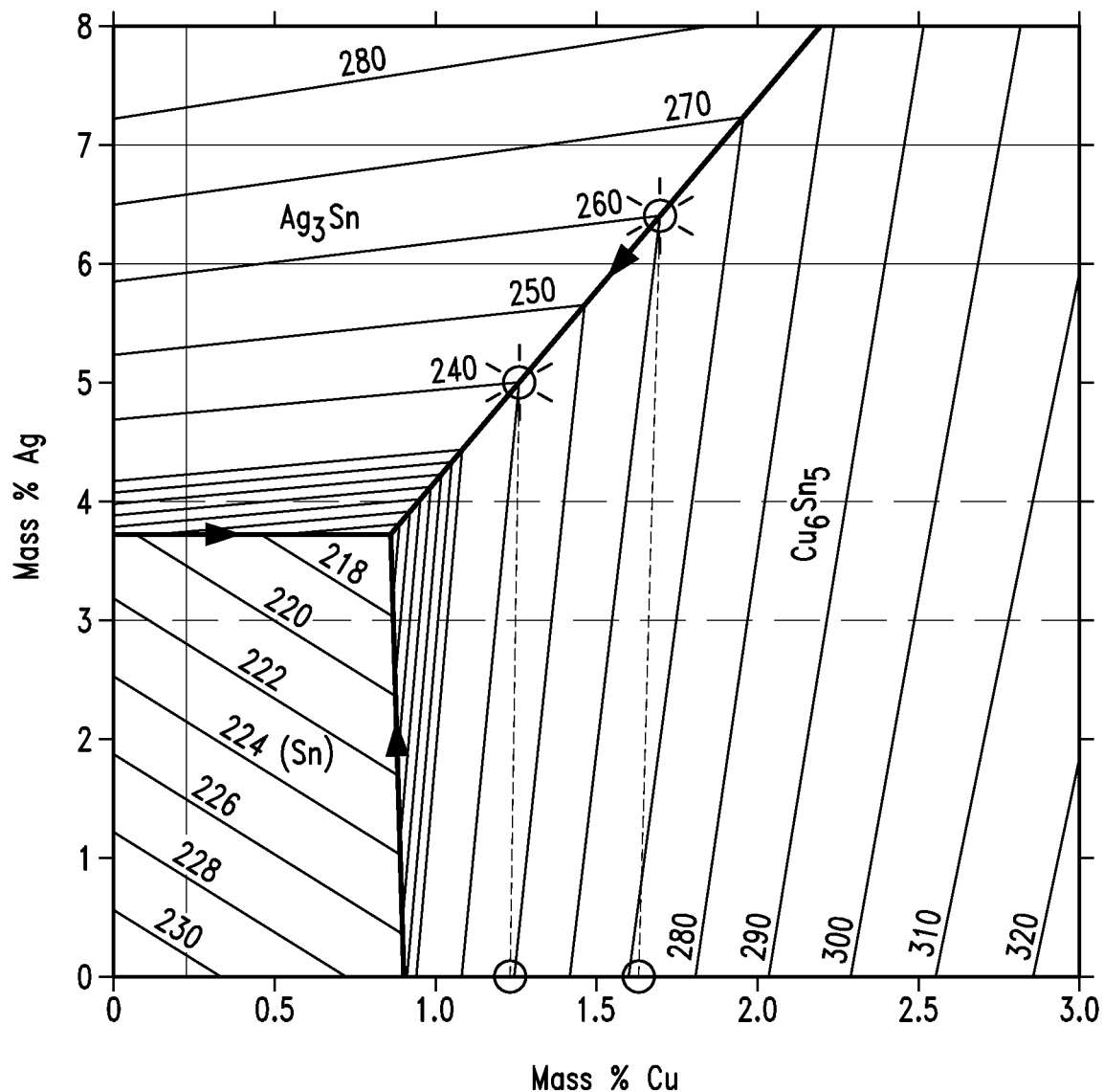
FIG. 3 is a phase diagram for a conductive material that includes silver, tin, and copper.

The amount of the second metallic constituent 145 that alloys with the first metallic constituent 144 can be controlled by several factors, including the temperature to which the material volume 140 and the third conductive layer 148 are elevated, and the amount of the second metallic constituent 145 available from the third conductive layer 148. The effects of these characteristics can be illustrated with an appropriate phase diagram. FIG. 3 is a phase diagram illustrating properties of a silver/tin/copper alloy. The vertical axis identifies the mass percentage of silver in the alloy, the horizontal axis identifies the mass percentage of copper in the alloy, and lines of constant melting point temperature are identified by the corresponding temperature values. Accordingly, FIG. 3 illustrates aspects of an alloying process that is carried out when the first metallic constituent 144 includes an alloy of tin and silver, and the second metallic constituent 145 includes copper.

Referring now to FIGS. 2I and 3 together, elevating a temperature of the workpiece 100 to about 240° C. will result in an alloy having about 1.2% copper. If the original material volume 140 includes less than 1.2% copper, then additional copper may be withdrawn from the third conductive layer 148. After cooling the microfeature workpiece 100, the subsequent melting point for the material volume 140 will be at least 240° C. In fact, in at least some embodiments, additional alloying may continue at lower temperatures (including room temperature), assuming an additional amount of the second metallic constituent 145 is available from the third conductive layer 148. Additional alloying may also occur during subsequent processes for which the temperature of the microfeature workpiece 100 is elevated.

In another example, the temperature of the microfeature workpiece 100 can be elevated to about 260° C. At this temperature, the resulting alloy in the material volume 140 can include about 1.6% copper. The subsequent melting point for the material volume 140 will be at least 260° C., which as described above, can increase over time due to continued alloying. In at least one embodiment, the alloy of the first and second metallic constituents 144, 145 can include at least 1% copper by weight. In other embodiments, the amount of the second constituent 145 can differ depending, for example, on the chemical makeup of both the first and second metallic constituents 144, 145.

Another method for controlling the amount of the second metallic constituent 145 that alloys with the first metallic constituent 144 is to control the thickness of the third conductive layer 148. For example, if the third conductive layer 148 includes copper, but includes only enough copper to provide an alloy that is about 1.2% copper, then, assuming the temperature of the workpiece 100 is elevated to at least 240° C., the amount of copper alloying with the first metallic constituent 144 will be limited to about 1.2%, even if subsequent low temperature or high temperature alloying is conducted. In other words, the entire volume of the third conductive layer 148 will enter into the material volume 140 to form an alloy. Conversely, if the third conductive layer 148 includes more of the second metallic constituent 145 than can alloy with the first metallic constituent 144 at a given temperature, then the amount of the second metallic constituent 145 alloying with the first metallic constituent 144 may be limited by the temperature at which the process is conducted. In this case, a first portion of the second metallic constituent 145 will migrate to the material volume 140, and a second portion will remain in the conductive layer 137.

The end result of an alloying process in accordance with several of the foregoing embodiments is that the melting point of the material volume 140 and/or the temperature at which the flowability of the material volume 140 increases, will be elevated. Accordingly, the material volume 140 will be less likely to melt or otherwise flow during subsequent processes that include heating the microfeature workpiece 100. As described further below, such processes can include attaching solder balls to the interconnect structure 150, and/or reflowing the solder balls to provide electrical connections to external devices.

Figure 4A:
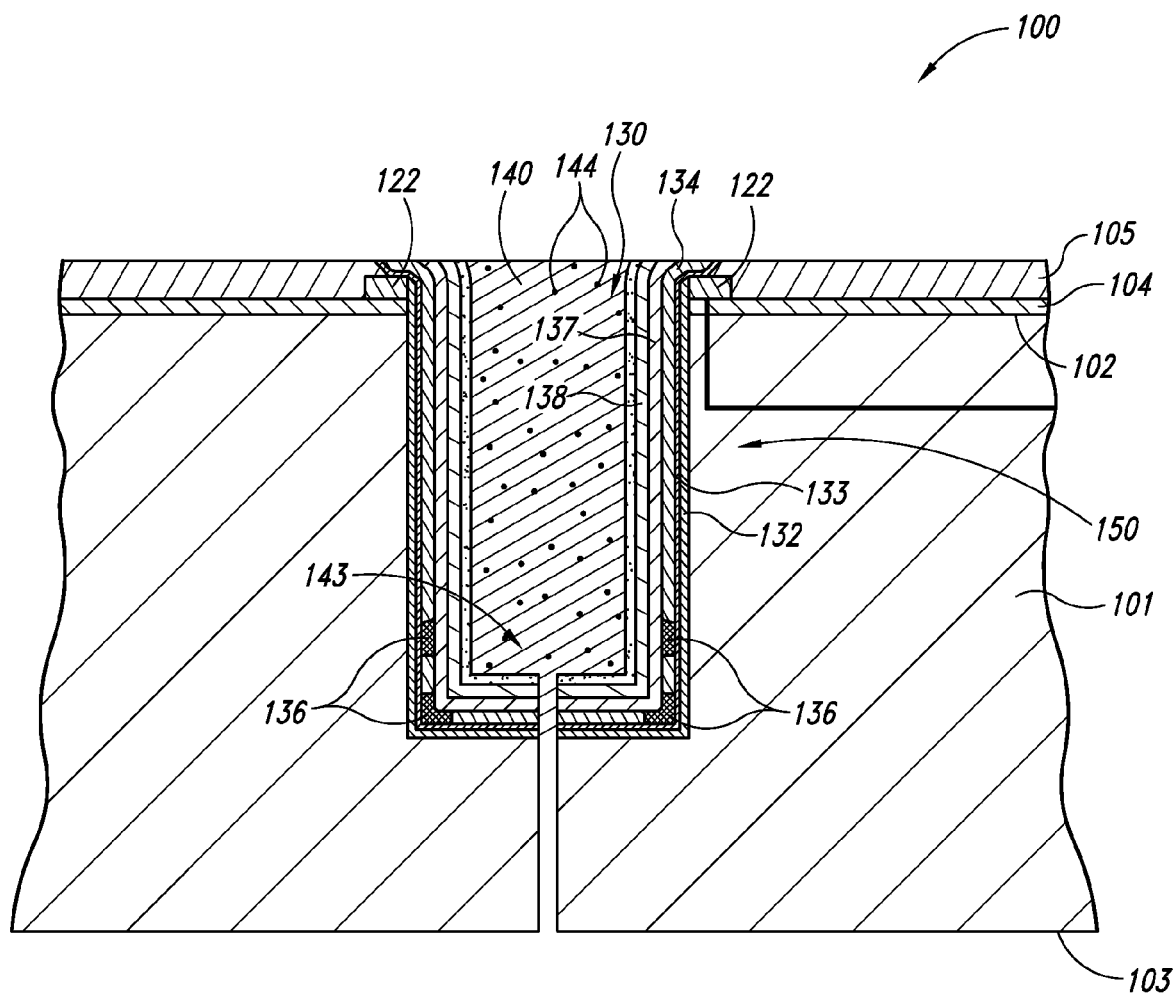
FIGS. 4A and 4B illustrate a process for completing an interconnect structure shown in FIGS. 2A-2I.
Figure 4B:
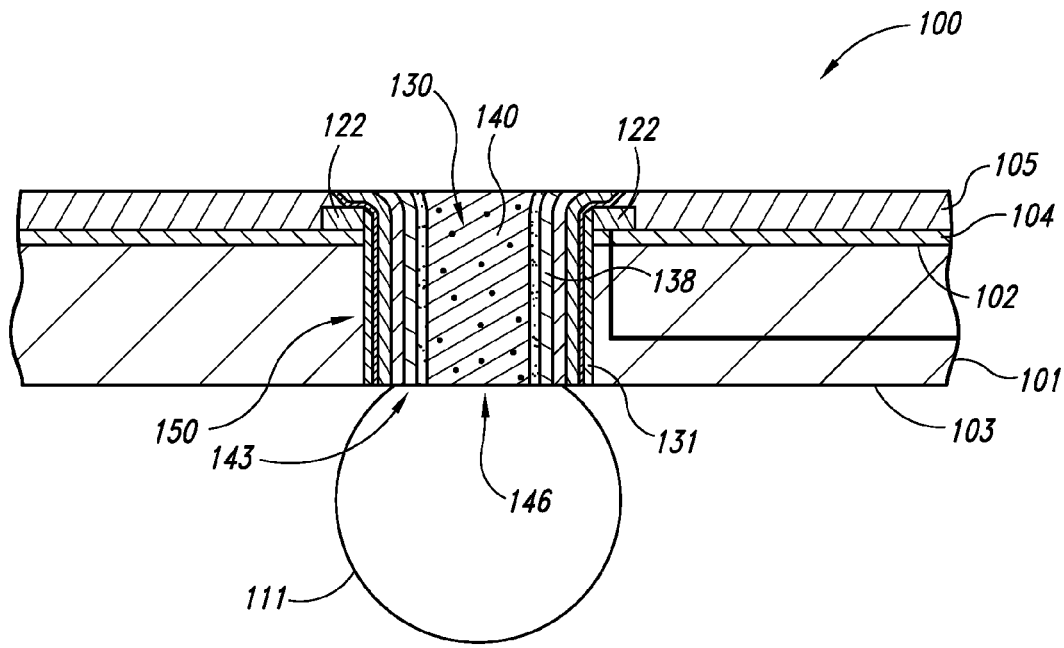

FIGS. 4A and 4B illustrate further manufacturing processes conducted to complete the formation of the microfeature workpiece 100. Referring first to FIG. 4A, the resist layer 107 shown in FIG. 2I can be removed from the substrate 101, and a suitable etching process can be used to remove the remaining portions of the seed layer 134 and the barrier layer 133 on the first side 102 of the substrate 101. The first side 102 of the substrate 101 can be planarized using a grinding, chemical mechanical planarization (CMP), and/or other suitable process. The via 130 can initially be a blind via that can be made to extend entirely through the substrate 101 by a back grinding process, as described in further detail below with reference to FIG. 4B.

FIG. 4B illustrates the substrate 101 after material has been removed from the second surface 103 to expose the second end 143 of the interconnect structure 150. Accordingly, the second end 143 of the interconnect structure 150 can form a second bond site 146 to which a solder ball or other conductive coupler 111 can be attached for coupling the workpiece 100 to external devices. The solder ball 111 can have a lower melting point than that of the alloyed material volume 140. Accordingly, when the temperature of both the material volume 140 and the solder ball 111 are elevated to attach the solder ball 111, the material volume 140 will be less likely to melt, flow or otherwise become displaced from the via 130.

Figure 5:
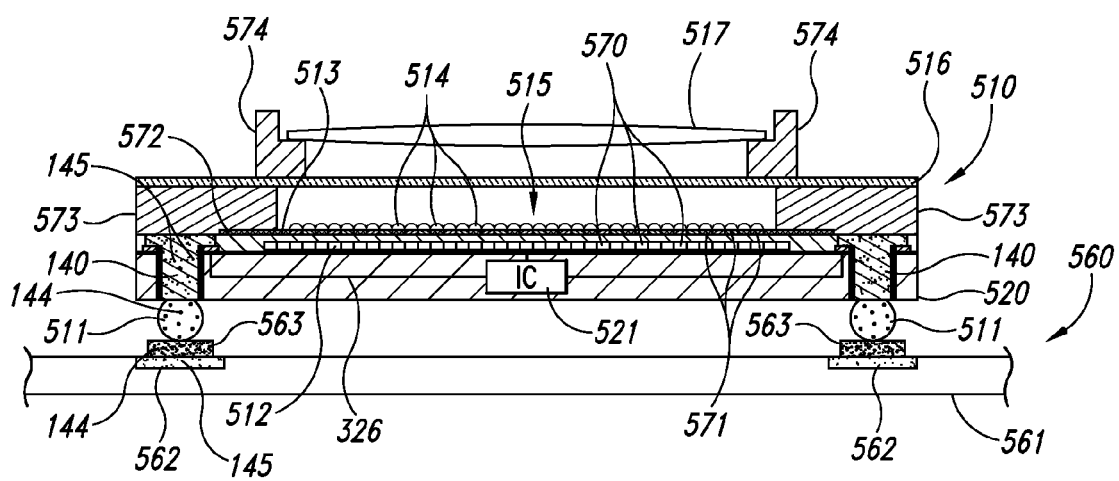
FIG. 5 illustrates an imaging device that includes through-wafer interconnects configured in accordance with an embodiment of the invention.
Figure 6:
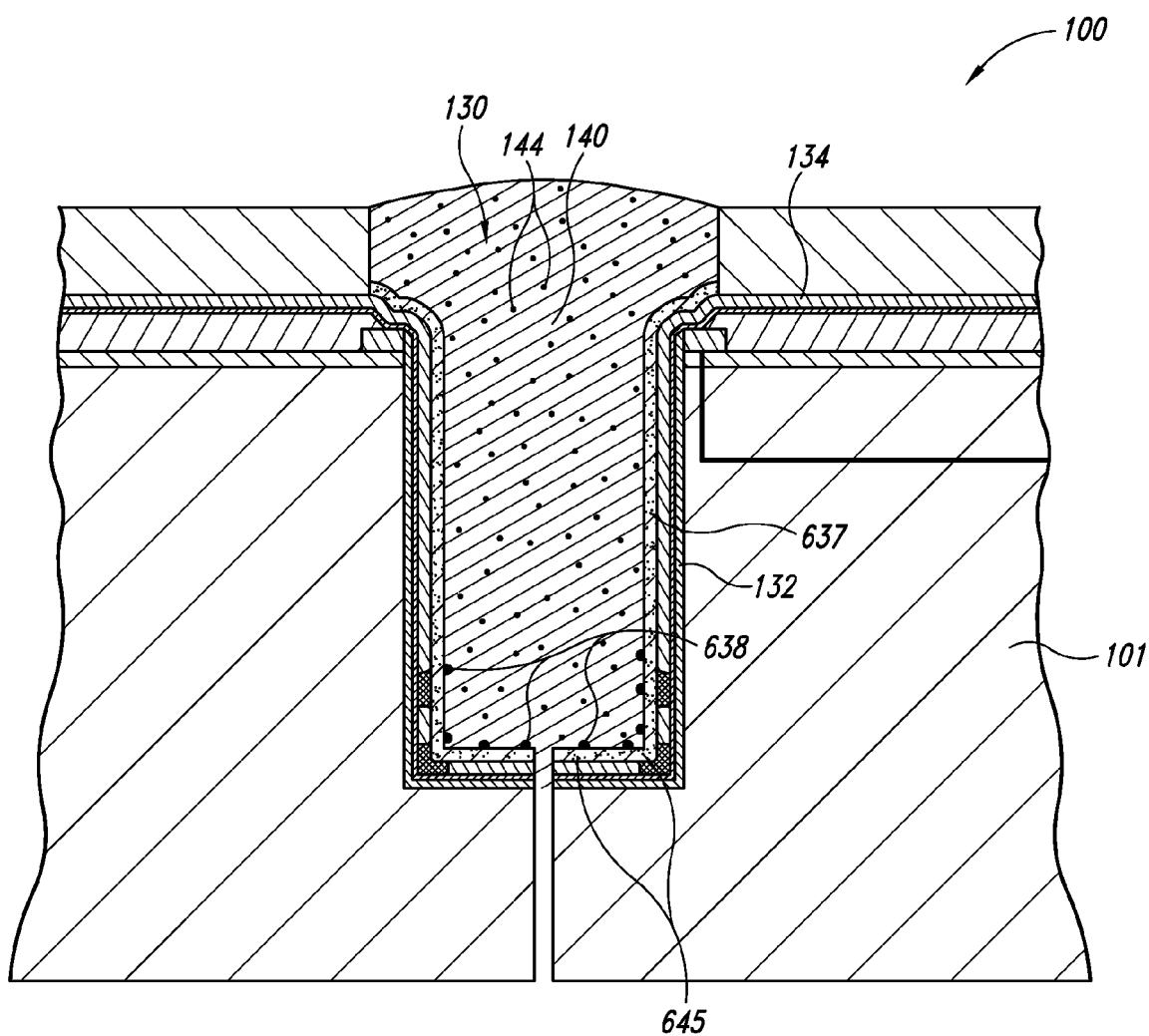
FIG. 6 illustrates a method for forming a through-wafer interconnect in accordance with another embodiment of the invention.

FIG. 5 is a partially schematic illustration of a finished imaging device 510 configured in accordance with an embodiment of the invention. The imaging device 510 can include a die 520 having an integrated circuit 521 coupled to an image sensor 512, which can in turn include an array of pixels 570 arranged in a focal plane. A color filter array (CFA) 513 is positioned over the pixels 570 of the sensor 512. The CFA 513 has individual filters or filter elements 571 configured to allow the wavelengths of light corresponding to selected colors (e.g., red, green, or blue) to pass to each pixel 570 of the image sensor 512. In the illustrated embodiment, for example, the CFA 513 is based on the RGB color model, and includes red filters, green filters, and blue filters arranged in a desired pattern over the corresponding pixels 570. The CFA 513 can further include a residual blue section 572 that extends outwardly from a perimeter portion of the image sensor 512. The residual blue section 572 helps prevent back reflection from the various components within the die 510.

The imaging device 510 can further include a plurality of microlenses 514 arranged in a microlens array 515 over the CFA 513. The microlenses 514 are used to focus light onto the initial charge accumulation regions of the image sensor pixels 513. Standoffs 573 are positioned adjacent to the microlens array 515 to support a transmissive element 516. The transmissive element 516 (which can include glass) is positioned to protect the microlens array 515 and other features of the die 520 from contamination. Lens standoffs 574 can be mounted to the transmissive element 516 to support a device lens 517. The device lens 517 is positioned a selected distance away from the microlens array 515 to focus light onto the microlens array 515 and ultimately onto the image sensor 512.

As is also shown in FIG. 5, the imaging device 510 can be attached to an external device 560, for example, a support member 561 (e.g., a printed circuitboard) having support member bond pads 562. The imaging device 510 can be attached to the support member 561 by (a) screen printing or otherwise applying a solder brick 563 (e.g., a combination of solder and flux) to the bond pads 562, (b) contacting the solder balls 511 with the solder bricks 563, and (c) applying heat so as to reflow or otherwise soften the solder balls 511 and the solder bricks 563. As described above with reference to FIG. 4B, the solder balls 511 can have a melting point that is lower than the melting point of the alloyed material volume 140. Accordingly, the material volume 140 can be less likely to flow during the attachment process and, as a result, the material volume 140 can be less likely to be pulled from the via in which it is placed. In a further aspect of this embodiment, material in the solder balls 511 (e.g., a first metallic constituent 144 such as tin/silver) can alloy with a second metallic constituent 145 (e.g., copper) present in the material volume 140. Accordingly, the melting point of the solder ball 511 can be raised during this process, making the solder ball 511 less likely to reflow or otherwise become displaced during subsequent high temperature processes.

In still a further aspect of an embodiment shown in FIG. 5, the solder bricks 563 can undergo a similar alloying process. For example, the solder bricks 563 can include a first metallic constituent 144 (e.g., a tin/silver alloy) that further alloys with a second metallic element 145 (e.g., copper) from the support member bond pads 562. As a result, the solder bricks 563 will also be less likely to become displaced during subsequent high temperature processes. Such subsequent processes can include attaching the support member 561 to other external devices.

One feature of at least some embodiments of the workpieces and associated formation techniques described above is that they can include elevating the melting point of the material volume 140 in the via 130 by alloying the first and second metallic constituents 144, 145. As was also described above, an advantage of the arrangement is that the material volume 140 will be less likely to become displaced (as a result of softening or melting) during subsequent high temperature processes. Accordingly, the reliability of the microfeature workpiece in which the material volume 140 is disposed can be increased.

Another feature of at least some embodiments of the workpieces and associated formation techniques described above is that they can include positioning a copper layer (e.g., the third conductive layer 148) in direct contact with a solder volume (e.g., the material volume 140). This is in direct contrast to at least some existing TWI structures, in which a nickel layer is positioned adjacent to the fill material in the via. Unlike existing TWI structures, in at least one aspect of the present invention, copper migration may be facilitated so as to produce the desired alloy in the via.

In one aspect of an embodiment described above with reference to FIG. 2G, a protective filling 139 was positioned in the via 130 to protect the interior of the via from debris that might be deposited in the via 130 as a result of forming the vent hole 141. In an embodiment shown in FIG. 6, the protective filling 139 was not used, or did not completely prevent particulates 638 from being directed into the via 130. The particulates 638 can include particulates of the substrate 101, for example, silicon particulates. In a particular aspect of the embodiment shown in FIG. 6, the workpiece 100 can include a conductive layer 637 that includes a second metallic constituent 645 selected to alloy with the particulates 638. For example, in one aspect of this embodiment, the conductive layer 637 can include gold, which, at elevated temperatures, can alloy with the silicon particulates 638. The gold can also alloy with the first metallic constituent 144 located in the material volume 140. An advantage of this arrangement is that it can reduce or eliminate the potential negative impact of the particulates 638 in the via 130. In another aspect of this embodiment, the conductive layer 637 is thick enough to undergo the alloying process without exposing the underlying seed layer 134. Accordingly, the substrate need not include the nickel layer described above with reference to FIG. 2H.

One aspect of several of the embodiments described above is that the material volume 140 was disposed adjacent to the walls of a via 130 prior to being alloyed with the second metallic constituent 145. In other embodiments, the material volume can be located adjacent to other structures of the microfeature workpiece. For example, the material volume can include the solder balls 511 and/or the solder bricks 563, either or both of which may undergo an alloying process, as described above with reference to FIG. 5. In still further embodiments, the alloying process can be used in other contexts. For example, referring now to FIG. 7A, a microfeature workpiece 700 can include a substrate material 701 in which a conductive line 718 and a corresponding via 730 have been formed to electrically connect to a bond pad 719 located at a bond site 722. The bond pad 719 can include a second metallic constituent 745, and a material volume 740 (e.g., a solder ball 711) can include a first metallic constituent 744. The bond pad 719 can initially have a thickness T1.

Figure 7A:
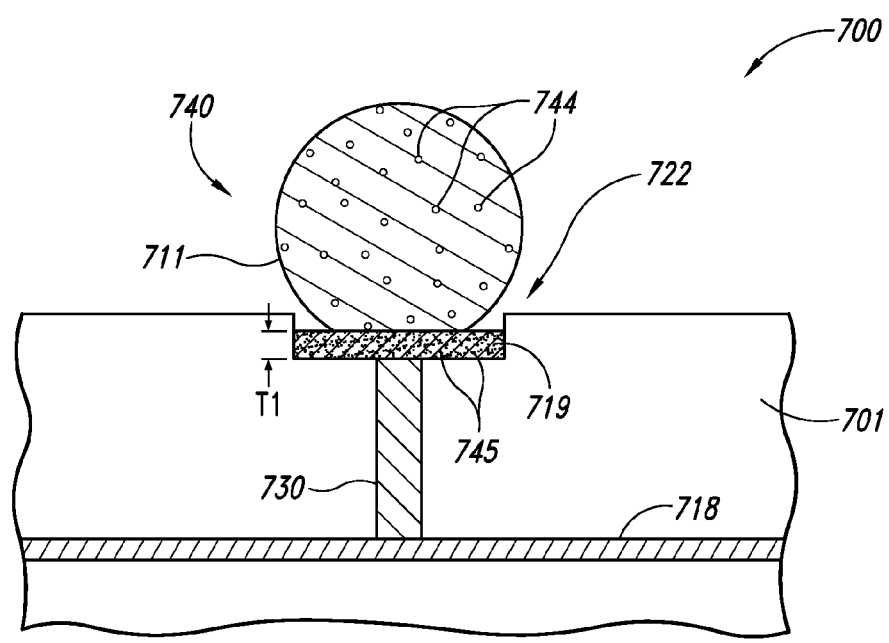
FIGS. 7A and 7B illustrate a method for forming a conductive connection at a bond pad in accordance with an embodiment of the invention.
Figure 7B:
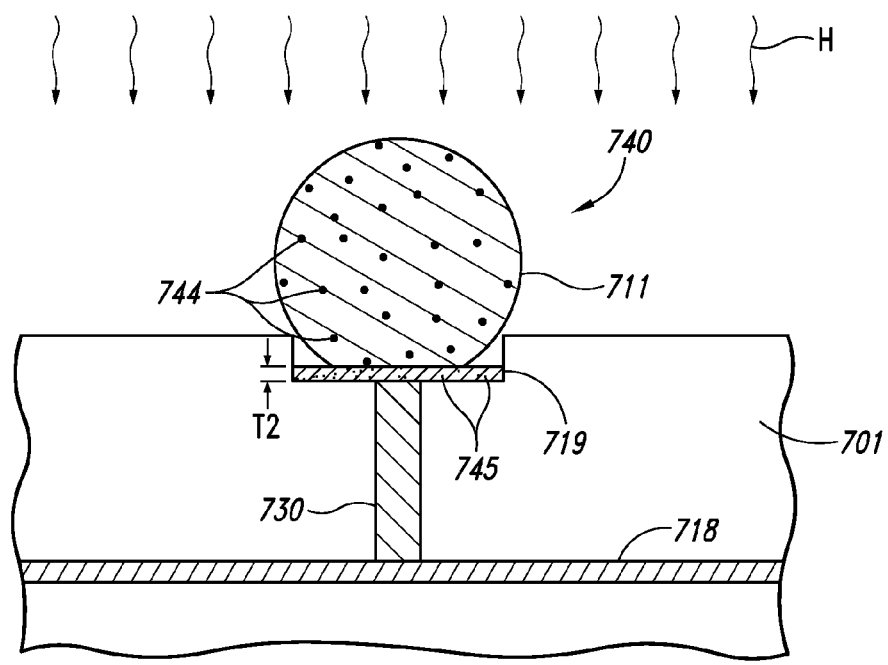

Referring next to FIG. 7B, heat H can be applied to the microfeature workpiece 700, in some cases causing the material volume 740 to melt or at least soften. As described above, the heat can also cause the second metallic constituent 745 to dissolve from the bond pad 719 into the material volume 740 and alloy with the first metallic constituent 744. The results of the foregoing operation can include a reduction in the thickness of the bond pad 719 from the initial thickness T1 (FIG. 7A) to a reduced thickness T2.

Figure 8A:
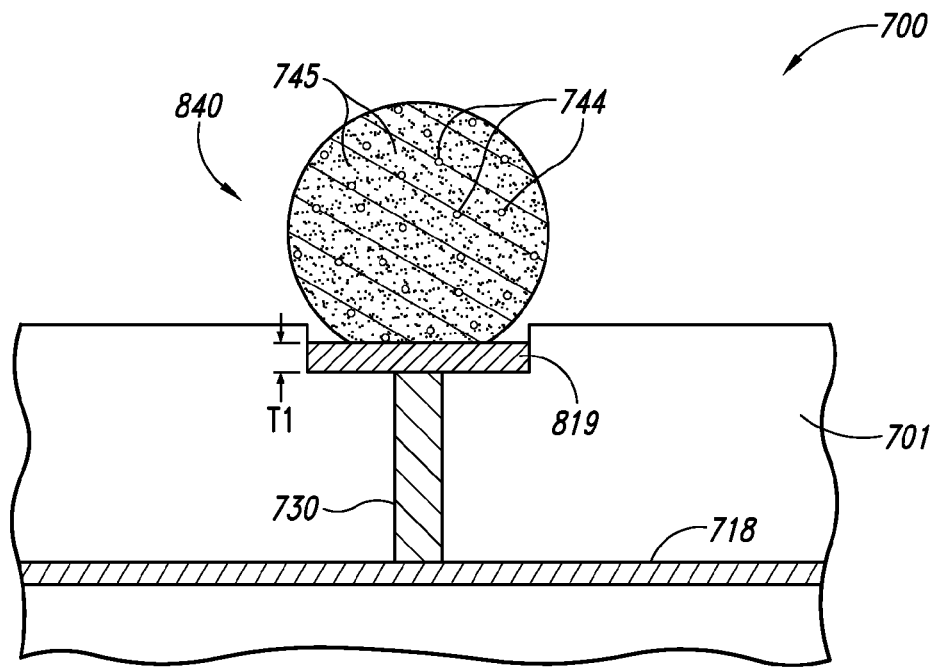
FIGS. 8A and 8B illustrate a method for forming a conductive connection at a bond pad in accordance with another embodiment of the invention.
Figure 8B:
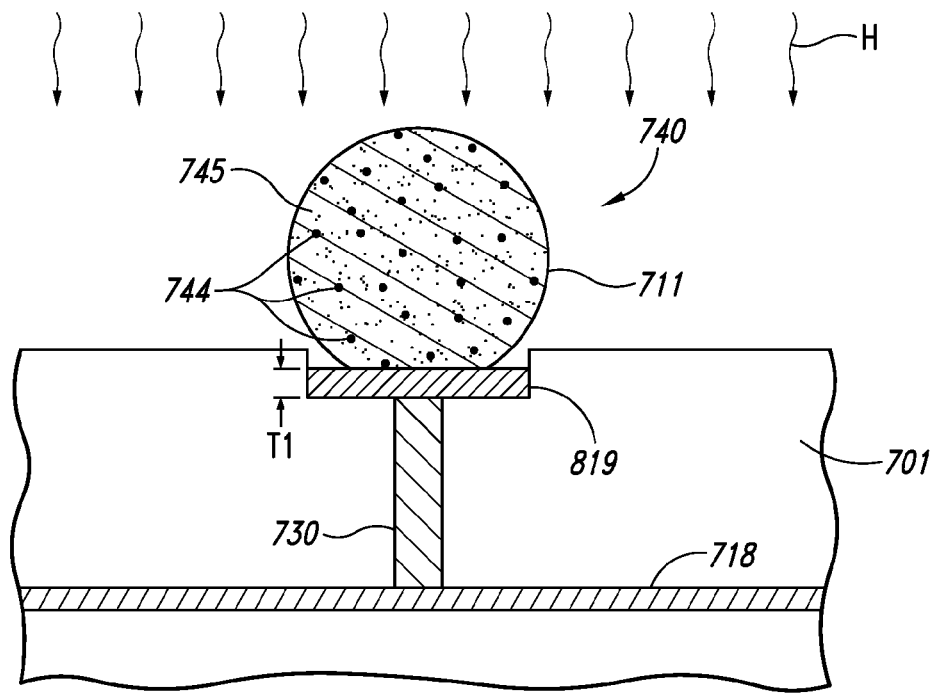

FIG. 8A illustrates the microfeature workpiece 700 having a bond pad 819 and a material volume 840 configured in accordance with another embodiment of the invention. In one aspect of this embodiment, the material volume 840 can include both the first metallic constituent 744 and the second metallic constituent 745. The bond pad 819 can include no second metallic constituent 745 (as shown in FIG. 8A), or it can optionally include an additional amount of the second metallic constituent 745 (as was generally shown in FIG. 7A). When heat is applied to the microfeature workpiece 700 (as shown in FIG. 8B), the first metallic constituent 744 can alloy with the second metallic constituent 745. If the bond pad 819 does not include the second metallic constituent 745, or if the amount of the second metallic constituent 745 in the material volume 840 is at or above a saturation level, then the thickness of the bond pad 819 is not expected to change as a result of the heating process. Otherwise, the thickness of the bond pad 819 can reduce in a manner generally similar to that described above with reference to FIG. 7B.

From the foregoing, it will be appreciated that specific embodiments of the invention have been described herein for purposes of illustration, but that various modifications may be made without deviating from the invention. For example, the material volume can be applied to sites of the workpiece other than an interconnect structure or a bond pad. The first and second metallic constituent can include elements and/or alloys other than those specifically identified above. In particular embodiments, the second metallic constituent can include multiple elements (e.g., copper and gold). In other embodiments, the conductive layers in the via can include successively sputtered layers of chrome, chrome/copper and then copper. Aspects of the invention described in the context of particular embodiments may be combined or eliminated in other embodiments. For example, a material volume that includes both the first and second metallic constituents, described in the context of FIGS. 8A and 8B, can be applied equally to the material volume described with reference to FIG. 2G. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A microfeature system, comprising:
a microfeature workpiece having a surface;
a via extending from the surface into the microfeature workpiece;
a first conductive material lining the via;
a second conductive material on the first conductive material, wherein the second conductive material is positioned to restrict migration of the first conductive material through the second conductive material;
a third conductive material on the second conductive material, the third conductive material having a first portion of a metallic constituent, the metallic constituent being the second of two metallic constituents; and
a volume of material positioned at least partially in the via, the volume of material including the first of the two metallic constituents, the volume of material further including a second portion of the second metallic constituent distributed generally throughout the volume of material.

2. The system of claim 1 wherein the surface includes a surface of a bond pad.

3. The system of claim 1 wherein the volume of material includes a volume of solder.

4. The system of claim 1 wherein the second metallic constituent includes copper.

5. The system of claim 1 wherein the second metallic constituent includes gold.

6. The system of claim 1 wherein the first metallic constituent includes at least one of tin and silver.

7. The system of claim 1 wherein the surface is a conductive surface and wherein the microfeature workpiece includes a first major surface and a second major surface facing opposite from the first major surface, and wherein the conductive surface includes a surface of the via extending through the microfeature workpiece from the first major surface to the second major surface, and wherein the volume of material includes a volume of solder positioned in the via.

8. The system of claim 1 wherein the first metallic constituent includes solder and wherein the second metallic constituent includes copper, further wherein the copper at the surface of the microfeature workpiece is in direct contact with the solder.

9. The system of claim 1 wherein the volume of material has a melting point of from about 240° C. to about 260° C.

10. A microfeature system, comprising:
a microfeature workpiece having a conductive surface;
a via extending from the surface into the microfeature workpiece;
a first conductive material lining the via;
a second conductive material on the first conductive material, wherein the second conductive material is positioned to restrict migration of the first conductive material through the second conductive material;
a third conductive material on the second conductive material, the third conductive material having a first portion of a metallic constituent, the metallic constituent being the second of two metallic constituents; and
a volume of material positioned adjacent to the conductive surface, the volume of material including first and second metallic constituents, wherein the second metallic constituent includes at least 1% copper by weight.

11. The system of claim 10 wherein the conductive surface includes a surface of a bond pad.

12. The system of claim 10 wherein the volume of material has a melting point of from about 240° C. to about 260° C.

13. The system of claim 10 wherein the first metallic constituent includes solder.

14. The system of claim 10 wherein the first metallic constituent includes solder, and wherein the solder includes silver and tin.

15. The system of claim 10 wherein the surface is a conductive surface and wherein the microfeature workpiece includes a first major surface and a second major surface facing opposite from the first major surface, and wherein the conductive surface includes a surface of the via extending through the microfeature workpiece from the first major surface to the second major surface, and wherein the volume of material includes a volume of solder positioned in the via.

16. A microfeature system, comprising:
a microfeature workpiece having a surface;
a via extending from the surface into the microfeature workpiece;
a first conductive material lining the via;
a second conductive material on the first conductive material, wherein the second conductive material is positioned to restrict migration of the first conductive material through the second conductive material;
a third conductive material on the second conductive material, the third conductive material having a first portion of a metallic constituent, the metallic constituent being the second of two metallic constituents; and
a volume of material positioned at least partially in the via, the volume of material including the first of the two metallic constituents, the volume of material further including a second portion of the second metallic constituent distributed generally throughout the volume of material, wherein the first metallic constituent is different than the second metallic constituent.

* * * * *